(12) United States Patent
Lee et al.

(10) Patent No.: US 9,646,562 B1
(45) Date of Patent: May 9, 2017

(54) SYSTEM AND METHOD OF GENERATING IMAGES ON PHOTOACTIVE SURFACES

(71) Applicant: Google Inc., Mountain View, CA (US)

(72) Inventors: Johnny Lee, Mountain View, CA (US); Eric Teller, Palo Alto, CA (US); William G. Patrick, San Fracisco, CA (US); Eric Peeters, Mountain View, CA (US)

(73) Assignee: X Development LLC, Mountain View, CA (US)

( * ) Notice: Subject to any disclaimer, the term of this patent is extended or adjusted under 35 U.S.C. 154(b) by 473 days.

(21) Appl. No.: 13/657,691

(22) Filed: Oct. 22, 2012

Related U.S. Application Data (60) Provisional application No. 61/636,458, filed on Apr. 20, 2012.

(51) Int. Cl.
  *G09G 5/00* (2006.01)

(52) U.S. Cl.
  CPC ....................... *G09G 5/00* (2013.01)

(58) Field of Classification Search
  CPC ............. G06K 9/00; G09G 2320/0666; G09G 2320/02; G09G 2320/04; G09G 2320/0233
  USPC .......................................................... 345/173
  See application file for complete search history.

(56) References Cited

U.S. PATENT DOCUMENTS

| | | |
|---|---|---|
| 5,319,747 A | 6/1994 | Gerrissen et al. |
| 5,719,395 A | 2/1998 | Lesniak |
| 6,256,033 B1 | 7/2001 | Nguyen |
| 6,266,158 B1 * | 7/2001 | Hata ................. G06T 9/20 382/232 |
| 6,495,833 B1 | 12/2002 | Alfano et al. |
| 6,840,627 B2 | 1/2005 | Olbrich |
| 7,259,747 B2 | 8/2007 | Bell |
| 7,474,286 B2 * | 1/2009 | Hajjar ..................... G09G 3/02 345/81 |
| 7,611,396 B2 | 11/2009 | Schnuckle |
| 8,237,654 B2 | 8/2012 | Kang |
| 8,603,723 B2 | 12/2013 | Chang et al. |

(Continued)

FOREIGN PATENT DOCUMENTS

EP    1591984 A2    11/2005

OTHER PUBLICATIONS

Masahiro Irie; "Diarylethenes for Memories and Switches"; Chemical Reviews 2000, vol. 100, pp. 1685-1716; Published on Web Apr. 21, 2000; American Chemical Society.

(Continued)

*Primary Examiner* — Carolyn R Edwards
*Assistant Examiner* — Carl Adams
(74) *Attorney, Agent, or Firm* — Blakely Sokoloff Taylor & Zafman LLP (57) ABSTRACT

An image generating system includes an electromagnetic ("EM") modulator, a camera module and a logic engine. The EM modulator is positioned to direct EM waves to a photoactive surface to stimulate the photoactive surface to generate an image. The camera module is positioned to monitor the photoactive surface to generate image data. The logic engine is communicatively coupled to the camera module and configured to receive the image data from the camera module and analyze the image data. The logic engine is communicatively coupled to the EM modulator to command the EM modulator where to direct the EM waves in response to the image data.

25 Claims, 6 Drawing Sheets

(56) References Cited

U.S. PATENT DOCUMENTS

| | | | |
|---|---|---|---|
| 8,730,183 B2 | 5/2014 | Lundback et al. | |
| 9,014,417 B1 | 4/2015 | Lee et al. | |
| 9,164,596 B1 | 10/2015 | Lee et al. | |
| 2001/0012001 A1 | 8/2001 | Rekimoto et al. | |
| 2002/0180687 A1* | 12/2002 | Webber | G02F 1/167 345/107 |
| 2003/0002016 A1* | 1/2003 | Sellen | H04N 9/3141 353/31 |
| 2004/0205394 A1 | 10/2004 | Plutowski | |
| 2005/0094109 A1 | 5/2005 | Sun et al. | |
| 2005/0105759 A1 | 5/2005 | Roberts et al. | |
| 2006/0007188 A1 | 1/2006 | Reiner | |
| 2006/0026521 A1 | 2/2006 | Hotelling et al. | |
| 2006/0176269 A1 | 8/2006 | Bergman et al. | |
| 2006/0227147 A1* | 10/2006 | Diels | G09G 3/3406 345/589 |
| 2006/0259184 A1 | 11/2006 | Hayes et al. | |
| 2007/0139367 A1 | 6/2007 | Goffin | |
| 2007/0150953 A1 | 6/2007 | Hamid et al. | |
| 2007/0225867 A1 | 9/2007 | Moorer et al. | |
| 2007/0268302 A1 | 11/2007 | Hsu | |
| 2007/0285399 A1 | 12/2007 | Lund | |
| 2008/0004953 A1 | 1/2008 | Ma et al. | |
| 2008/0018558 A1* | 1/2008 | Kykta | G03B 21/567 345/58 |
| 2009/0168027 A1 | 7/2009 | Dunn et al. | |
| 2009/0237011 A1* | 9/2009 | Shah | H05B 33/0803 315/312 |
| 2010/0060670 A1* | 3/2010 | Kuo | G09G 5/02 345/690 |
| 2010/0103330 A1* | 4/2010 | Morrison | H04N 9/3185 348/744 |
| 2010/0160041 A1 | 6/2010 | Grant et al. | |
| 2011/0161998 A1 | 6/2011 | Alberth et al. | |
| 2011/0221599 A1 | 9/2011 | Högasten | |
| 2012/0050687 A1 | 3/2012 | Berry et al. | |
| 2012/0076353 A1* | 3/2012 | Large | G03B 17/54 382/103 |
| 2012/0106922 A1* | 5/2012 | Tsukagoshi | G03B 21/142 386/230 |
| 2012/0154511 A1 | 6/2012 | Hsu et al. | |
| 2012/0218417 A1 | 8/2012 | Bilger et al. | |
| 2013/0050258 A1 | 2/2013 | Liu et al. | |
| 2013/0128583 A1* | 5/2013 | Hikmet | G02B 5/0221 362/259 |

OTHER PUBLICATIONS

M. Irie, T. Lifka, S. Kobatake, and N. Kato; "Photochromism of 1,2-Bis(2-methyl-5-phenyl-3thienyl)perfluorocyclopentene in a Single-Crystalline Phase"; Journal of the American Chemical Society 2000, vol. 122, pp. 4871-4876; Published on Web May 6, 2000; American Chemical Society.

M. Morimoto, S. Kobatake, and M. Irie; "Multicolor Photochromism of Two- and Three-Component Diarylethene Crystals"; Journal of the American Chemical Society 2003, vol. 125, pp. 11080-11087; Published on Web Aug. 13, 2003; American Chemical Society.

D. Saakes et al.; "Slow Display"; Presented at Siggraph 2010 Emerging Technologies. Abstract PDF; Retrieved Oct. 17, 2012, from http://web.media.mit.edu/~saakes/slowdisplay/pdf/slow_display.pdf (1 page).

K. Mori et al.; "One-Color Reversible Control of Photochromatic Reactions in a Diarylethene Derivative: Three-Photon Cyclization and Two-Photon Cycloreversion by a Near-Infrared Femtosecond Laser Pulse at 1.28 μm"; Journal of the American Chemical Society 2011, vol. 133, pp. 2621-2625; Published on Web Feb. 4, 2011; American Chemical Society.

Sun Innovations, Inc., © 2008-2011; Retrieved Oct. 17, 2012, from http://sun-innovations.com/ (2 pages).

Tomoko Hashida; "Hand-rewriting"; Video; Screenshots Retrieved Oct. 17, 2012, from http://vimeo.com/41071692 (3 pages).

"Zombie-licious: Making Monsters with Lasers and Glow Paint," <http://gajitz.com/zombie-licious-making-monsters-with-lasers-and-glow-paint/>, Printed Aug. 6, 2012, 3 pages.

U.S. Appl. No. 13/657,372, filed Oct. 22, 2012, Lee et al.

* cited by examiner

SYSTEM AND METHOD OF GENERATING IMAGES ON PHOTOACTIVE SURFACES

CROSS REFERENCE TO RELATED APPLICATIONS

This application claims priority under the provisions of 35 U.S.C. §119(e) to U.S. Provisional Application No. 61/636,458 filed on Apr. 20, 2012.

TECHNICAL FIELD

This disclosure relates generally to optics, and in particular but not exclusively, relates to image generation.

BACKGROUND INFORMATION

Displaying information is performed by monitors, televisions, and projectors, just to name a few. Large displays can be prohibitively expensive as the cost to manufacture display panels rises exponentially with display area. This exponential rise in cost arises from the increased complexity of large monolithic displays, the decrease in yields associated with large displays (a greater number of components must be defect free for large displays), and increased shipping, delivery, and setup costs. A scheme of tiling smaller display panels to form larger multi-panel displays is also sometimes used to display information, but that scheme is still quite costly and may include distracting seams between tiles. Projectors can generally project large images, but often suffer from poor contrast ratios. In addition, conventional technologies typically have high power consumption per square inch of displayed information, making displaying images on a large-scale quite costly, especially at acceptable contrast ratios. A display system capable of displaying high-contrast images (especially on a large-scale) with better power efficiencies than conventional technologies is desirable.

BRIEF DESCRIPTION OF THE DRAWINGS

Non-limiting and non-exhaustive embodiments of the invention are described with reference to the following figures, wherein like reference numerals refer to like parts throughout the various views unless otherwise specified.

DETAILED DESCRIPTION

Embodiments of a system and method of generating images on a photoactive surface are described herein. In the following description, numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Throughout this specification, several terms of art are used. These terms are to take on their ordinary meaning in the art from which they come, unless specifically defined herein or the context of their use would clearly suggest otherwise.

Figure 1:
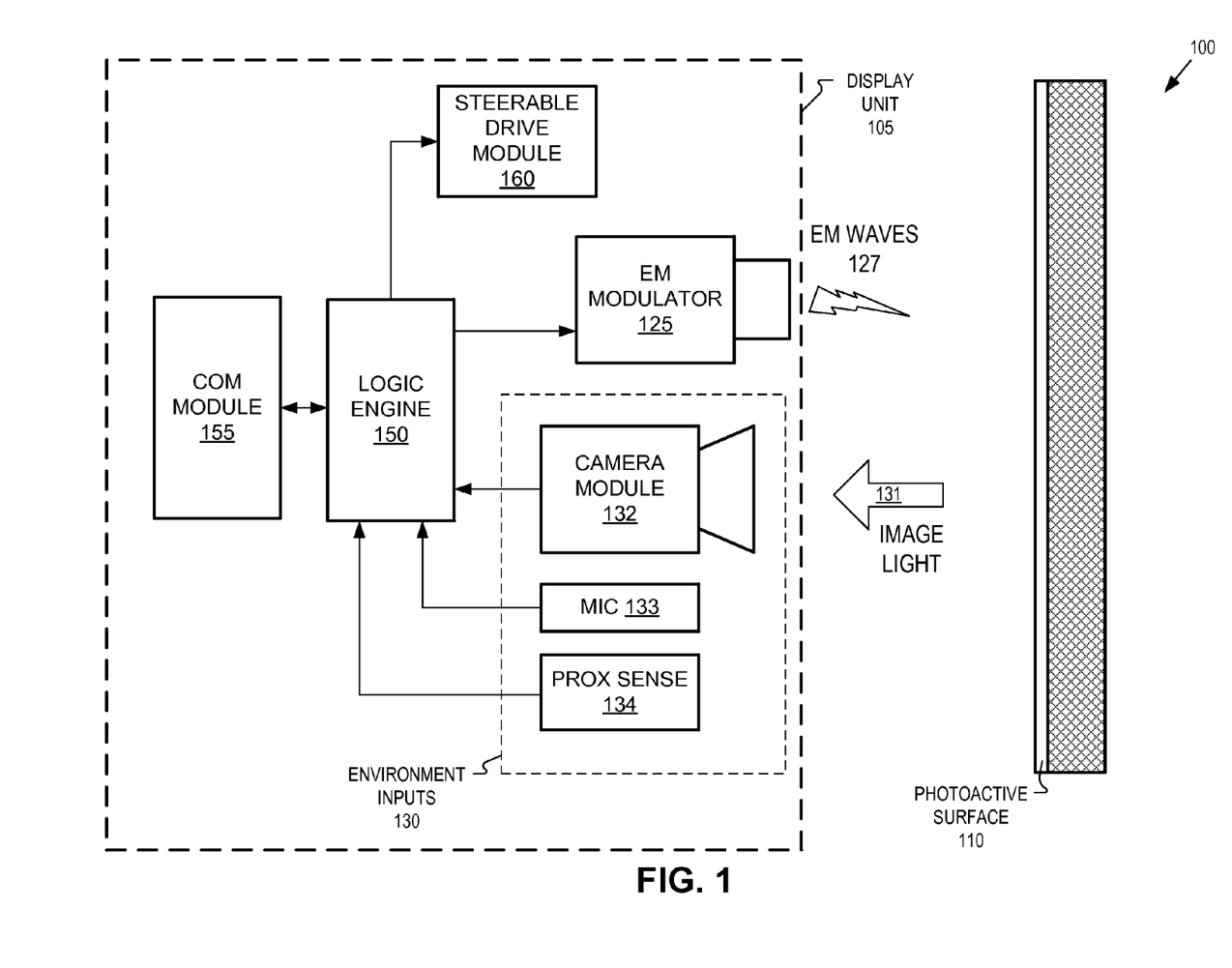
FIG. 1 illustrates an example block diagram system of a display unit that includes an electromagnetic modulator that directs electromagnetic waves to a photoactive surface and a camera module that receives image light from the photoactive surface, in accordance with an embodiment of the disclosure.

FIG. 1 illustrates an example block diagram system including a display unit 105 and photoactive surface 110, in accordance with an embodiment of the disclosure. The illustrated display unit 105 includes an electromagnetic ("EM") modulator 125, a logic engine 150, a communication module 155, a steerable drive module 160 and environment inputs 130. The illustrated environment inputs 130 include a camera module 132, a microphone 133, and a proximity sensor 134.

EM modulator 125 directs EM waves 127 to photoactive surface 110 and camera module 132 receives image light 131 from photoactive surface 110. The EM modulator is positioned to direct EM waves 127 to photoactive surface 110 to stimulate the photoactive surface in a pattern to generate an image. In one example, the photoactive surface is photoactive material infused paint that is painted on drywall or paneling of a room in a home, work, or entertainment space. Photoactive paint can also be applied on ceilings, furniture, or other objects to make a photoactive surface. Compared to televisions, the photoactive paint can be applied to a variety of large-scale surfaces. An example of a large-scale photoactive surface is a wall, or a collection of walls in a living/working/entertainment/meeting space that are coated with a photoactive material. A large-scale photoactive surface could also include a fabric, rigid sheet, or panel that is coated or infused with photoactive material. A large-scale photoactive surface is a photoactive surface sized approximately the size (area) of a big-screen television (e.g. approximately 15.5×27.5 inches, a.k.a. 32 inches diagonal), or larger. The large-scale photoactive surface may not be rectangular or even have straight lined borders. One large-scale photoactive surface may span two flat surfaces, such as a wall. It is appreciated that the image(s) displayed on the large-scale photoactive surface may not necessarily be as large as the large-scale photoactive surface.

In one embodiment, EM modulator 125 includes a steerable laser that can be directed to draw an image on photoactive surface 110. The laser may be capable of raster scanning and may be coupled to a servo motor. In one embodiment, the laser is coupled with an electric lens to selectively focus the laser light onto photoactive surface 110. In one embodiment, EM modulator 125 includes a laser with micromirrors paired with micro-electro-mechanical systems ("MEMS") actuators, such as Digital Light Processing ("DLP™") technology. The laser may be capable of modulating a duty cycle and/or duration of the laser light output.

EM modulator 125 may include multiple lasers that are configured to emit laser light at different wavelengths, depending on the material in the photoactive surface. Possible photoactive materials include photoluminescent and photochromic materials. Photoluminescent materials absorb energy from photons from non-visible light and re-emit the energy from the photons as visible light. Photochromic materials are "reflective" in that they reflect visible (e.g. ambient) light and can be stimulated to change how they reflect the visible light, including reflecting specific colors of visible light. The stimulation of the photochromic materials may be done by electromagnetic waves or pulses, which may include electron beams, visible light, and/or non-visible light (e.g. ultraviolet ("UV"), near-infrared ("NIR"), infrared ("IR")). In one example, a chemical composition known as Spiropyrans are stimulated with UV light, which causes a chemical reaction that makes the Spiropyran chemical reflect colored light. Another possible photoactive material would be a thermochromic material that changes the light the material absorbs/reflects based on its temperature. Photo-active paints are available from companies such as DuPont™, 3M™, and others. Therefore, using photoluminescent, photochromic, and thermochromic materials separately or in combination offers a wide variety of ways to create an image and even color images on a photoactive surface. EM modulator 125 can be configured to include one or more of the appropriate stimulators (e.g. lasers with different wavelengths) to stimulate an image on the photoactive material selected.

The "decay time" of the material is the amount of time that the stimulation of the material affects the optical output or reflection of the material. Some of the decay times of the materials can be characterized as "half-lives" because of their rate of decay. As an example, the materials may have half-lives of 0.5 seconds, one second, or thirty minutes. When a material is first stimulated, it may turn black, but then fade to gray, and eventually white if it is not re-stimulated to turn black. The half-lives can vary depending on the particular chemical composition of the material. Some of the materials have more digital or bi-stable characteristics, meaning they don't slowly fade from black to white. Rather, these bi-stable materials may maintain a pigment or color until affirmatively switched back by a stimulus (e.g. certain temperature or wavelength). For these materials, a first stimulation (e.g. light of a first wavelength) may stimulate the material to turn black or "ON", while a second, different stimulation (e.g. light of a different wavelength than the first wavelength), may cause the material to turn white or "OFF." For thermochromic materials, the material may be stimulated to a first color by stimulating the material with a first wavelength, which causes the material to reach a certain temperature that causes a chemical reaction. The thermochromic material may then need to be cooled by a different stimulus to cause the material to switch back to white. This may appear as erasing the image by a person that is viewing the thermochromic material.

In one example, a photochromic compound is stimulated with a laser light of a first intensity to cause colorization of the photochromic compound and laser light of a second intensity stimulates the photochromic compound to cause de-colorization of the photochromic compound. In still another example, a photochromic material may reflect different colors of light based on the wavelength of the stimuli. Hence, the same material can reflect red, green, and blue light if stimulated with the proper wavelength of light. Therefore, EM modulator 125 may be configured with three or more steerable or guided lasers that can stimulate a material with different wavelengths of light to generate different colors for generating an image.

Display unit 105 may display a registration image and use image data from camera module 132 to determine what type of paint or coating is on a given photoactive surface and how large the surface is. Display unit 105 may stimulate the photoactive surface with different EM waves 127 to ascertain what types of photoactive materials are in its environment (e.g. a room). After ascertaining what type of photoactive materials are in its environment, display unit 105 may adjust its EM modulator 125 settings to a different wavelength and certain refresh rate based on a half-life of the photoactive material. Based on the size of the painted area, the display image can be scaled/zoomed or shifted for alignment onto the photoactive area.

Still referring to FIG. 1, the environment inputs 130 are coupled to a logic engine 150. Logic engine 150 is communicatively coupled to the camera module 132 and configured to receive image data from camera module 132 and analyze the image data. Logic engine 150 is coupled to microphone 133 to receive sound signals received by microphone 133. Proximity sensor 134 is configured to receive proximity signals from a tag and communicatively coupled to send a proximity alert signal to logic engine 150 when a "tag" is proximate to the proximity sensor. In response to a sound signal or proximity alert signal, logic engine 150 may command EM modulator 125 to display a certain image or sequence of images on photoactive surface 110. It is appreciated that environment inputs 130 may include more inputs and hardware than what is shown in FIG. 1. Environment inputs 130 may include instruments to measure temperature data, humidity data, and/or atmospheric pressure. Logic engine 150 may include a processor a Field Programmable Gate Array ("FPGA"), or other logic for processing image data and environment inputs 130. Logic engine 150 may include memory to store settings, images, and image data received from camera module 132.

Figure 2:
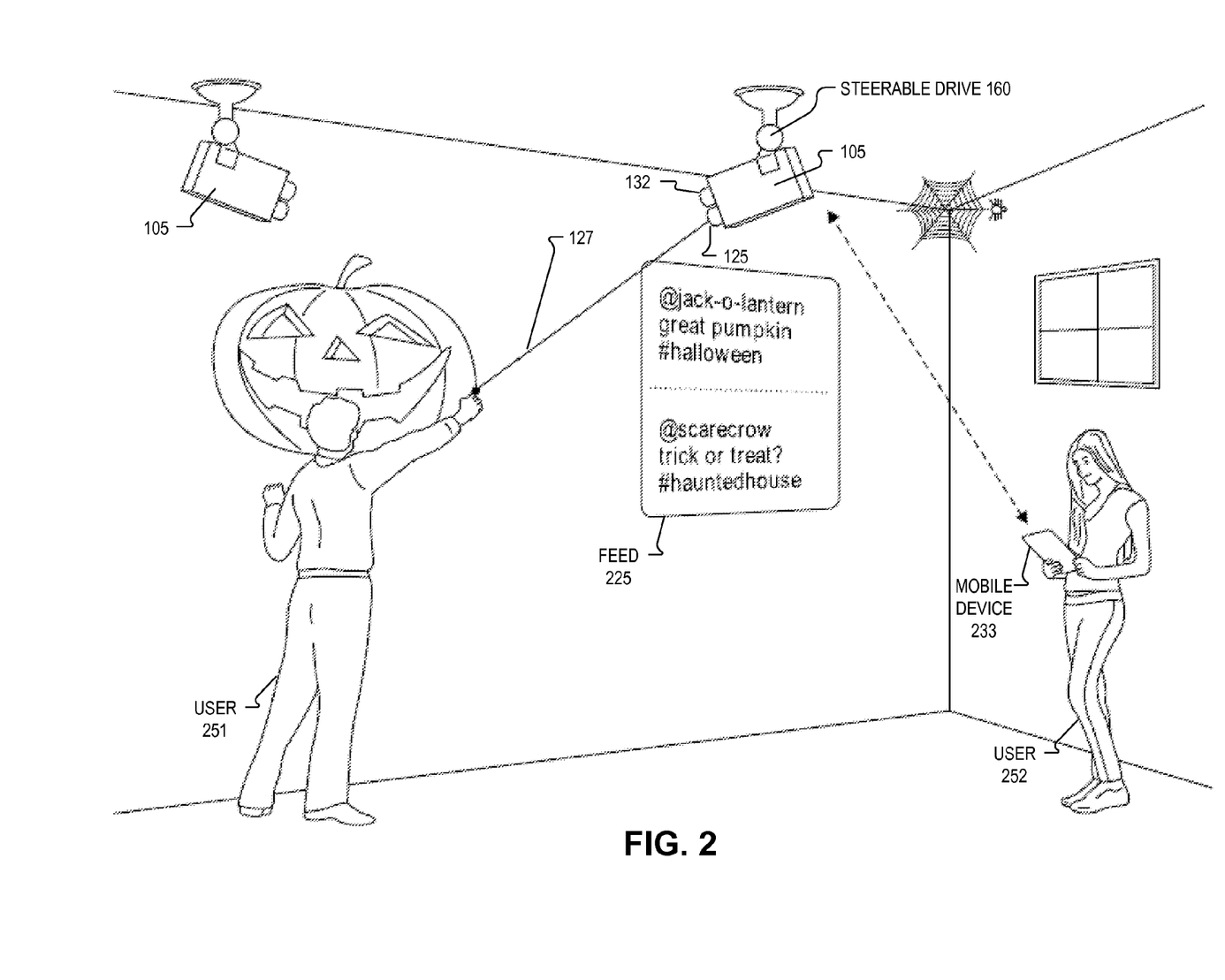
FIG. 2 shows two display units mounted on a ceiling of a room and images on photoactive surfaces that the two display units have generated by stimulating the photoactive surfaces with electromagnetic waves, in accordance with an embodiment of the disclosure.

FIG. 2 shows two display units 105 mounted on a ceiling of a room and images on photoactive surfaces that the two display units have generated by stimulating the photoactive surfaces with electromagnetic waves, in accordance with an embodiment of the disclosure. Display unit 105 may include an electrical connector to be coupled to an overhead lighting socket to provide power to display unit 105. In one embodiment, the electrical connector is an Edison-type connector to be plugged into a conventional Edison-style light socket.

In FIG. 2, the walls and the ceiling of the room are painted with a photoactive material. The display units 105 are stimulating the photoactive surfaces (walls and ceiling) with EM waves 127 according to a Halloween theme. One of the display units 105 has already stimulated the photoactive surface in the corner of the room to generate a spider web image. Display unit 105 "found" the corner of the room using logic engine 150 to process image data captured by camera module 132. Logic engine 150 then commanded EM modulator 125 where to draw the spiderweb. User 251 is tracing a pumpkin/jack-o-lantern on the photoactive wall with his finger, while display unit 105 follows the finger of user 251 with EM waves 127 to stimulate the photoactive surface to generate the pumpkin/jack-o-lantern image. Display unit 105 uses camera module 132 and logic engine 150 to ascertain where user 251 is tracing/drawing on the wall and logic engine 150 commands EM modulator 125 to direct EM waves 127 to the correct location on the photoactive surface. Display unit 105 has also stimulated the photoactive material on the wall to generate an information feed 225 that includes social networking data. Other users at the event may be able to contribute information that display unit 105 then posts on the wall. Display unit 105 may have to continually stimulate the photoactive surface to maintain the contrast of feed 225. Or, display unit 105 can update feed 225 with different information (letting the old information fade according to the half-life of the material), or stimulate the photoactive material to erase feed 225 and then update it.

Logic engine 150 is coupled to a communication module 155 which may be coupled to a wired communication link (e.g. ethernet) or have wireless communication capabilities (e.g. Wi-Fi and/or BlueTooth). User 252 holding mobile device 233 may be able to command display unit 105 over a wireless connection. User 252 may be able to change the "theme" of the room with her mobile device 233. Possible themes could be sports related, holiday related, or event-centric themes. Display unit 105 may also stimulate the photoactive walls and ceilings to display a decorative theme based on the colors present in the room.

As mentioned above, display unit 105 has a variety of environment inputs 130. Camera module 132 may be used to capture image data to be analyzed. Using the image data, logic engine 150 may recognize a person (image recognition) and display images on the wall according to settings configured by the recognized person. Sports scores, stock tickers, weather reports, reminders, calendars, clocks, books, and recipes are possible images for display. Using the image data, logic engine 150 may recognize formal gestures from users and take actions using communication module 155. In one example, display unit 105 displays a light switch on a wall and recognizes a user gesturing to turn on or off the lights. Logic unit 150 may command communication module 155 to send a command to an electrical switch that controls overhead lighting, based on the user gesture. Using the image data, logic engine 150 may recognize certain events (e.g. movement in the room) or contexts (ambient light brightness) and cause EM modulator 125 to display information in response. Camera module 132 may also capture image data analyzed for environmental factors such as brightness in the room. The duty cycle or refresh rate of EM modulator 125 may be changed depending on the room brightness to maintain an acceptable contrast ratio of the image, while also minimizing power consumption.

Display unit 105 may also recognize sounds using microphone 133 and display an image in response. It may respond to voice commands from a user. Display unit 105 may recognize songs, televisions shows, or movies and display an image or series of images that correspond with the sound input received from microphone 133. Proximity sensor 134 may receive proximity signals from a "tag" located, for example, on a key chain or embedded in a mobile device, and display unit 105 may display an image in response to receiving the proximity signals.

As shown in FIG. 2, a room or objects that are painted with a photoactive material may create a large canvas for images to be displayed. Additionally, the photoactive material can be applied to walls, corners, and ceiling to provide a continuous display surface. The size of the images can potentially be much bigger than a big screen television and for much less cost than a display of that size. Steerable drive 160 allows display unit 105 to pan/tilt/rotate to generate images on potentially almost every surface in the room. Steerable drive 160 is communicatively coupled to the logic engine and configured to orient at least EM modulator 125 toward the photoactive surface, in response to receiving motion commands from logic engine 150. In one embodiment of display unit 105, EM modulator 125 and camera module 132 are mechanically coupled in a fixed position to reduce or eliminate the need to calibrate EM modulator 125 with camera module 132.

Due to the decay time of the photoactive material(s), the images displayed by display unit 105 on photoactive surfaces may not have the high refresh rate required for watching sporting events or movies and may be best suited for displaying static or slow changing images. However, the decay time may give display system 100 a large power advantage over conventional displays and projectors. In one example, the photoactive material only needs to be re-stimulated or refreshed every ten seconds, while still maintaining an acceptable contrast ratio. Of course, different photoactive materials may have higher or lower half-lives. The watts per square inch needed to present an image using display system 100 may be orders of magnitude less than displays and projectors due to the lower refresh rate required to maintain the image. The efficiency of display system 100 may allow it to be in a pico-projector or a cell phone for easy display of digital slides in presentation software. In yet another advantage, the persistence of images without constantly refreshing the images can be helpful compared to a traditional projector system because the image can still be displayed on photoactive surface 100 even if a person or object temporarily blocks the EM modulator's line of site to photoactive surface 110.

Figure 3:
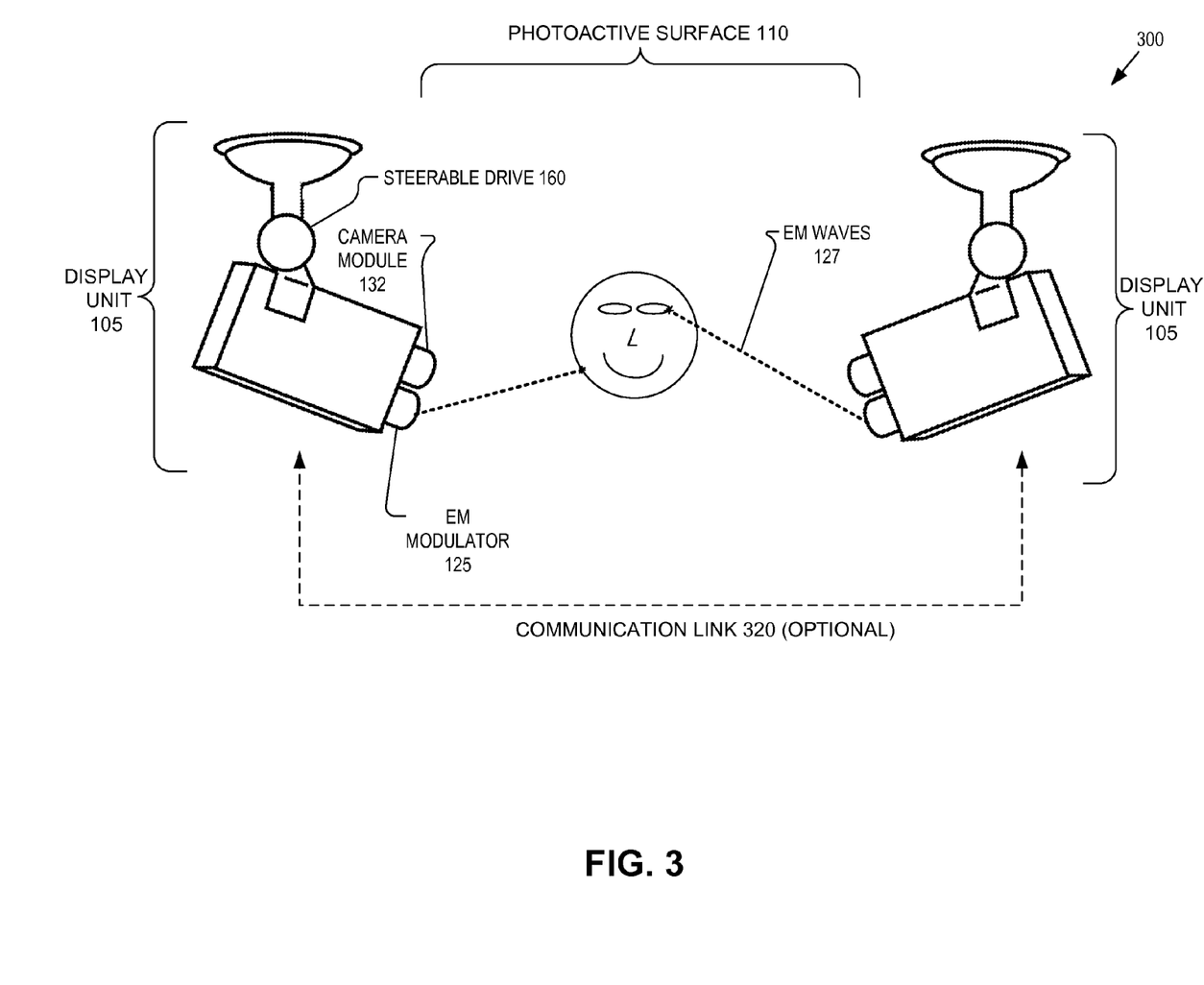
FIG. 3 illustrates two display units generating an image on a photoactive surface, in accordance with an embodiment of the disclosure.

FIG. 3 illustrates a dual display unit system 300 that includes two display units 105 generating an image (e.g. smiley-face) on photoactive surface 110, in accordance with an embodiment of the disclosure. Since system 300 includes two display units 105, both display units can share in the duties of completing the same image or multiple images. Additionally, camera modules 132 of each display unit 105 may be used to detect obstructions and then the other display unit 105 can continue stimulating photoactive surface 110 to generate the image. Display units 105 may be in implicit communication, meaning that a second display unit 105 may determine (using camera module 132 and logic engine 150) that a first display unit 105 is not completing or refreshing an image. Therefore, the second display unit 105 will continue the completing or refreshing of the image.

FIG. 3 also shows an optional communication link 320 between the two display units 105. The communication link 320 could be wired or wireless and allow explicit communication between logic engines 150 of the display units 105. If the first display unit 105 detects an obstruction, then it can explicitly hand off the task of completing or refreshing the image to the second display unit 105. Thus, the display units 105 can stitch together the images on a pixel-by-pixel basis, if necessary.

Figure 4:
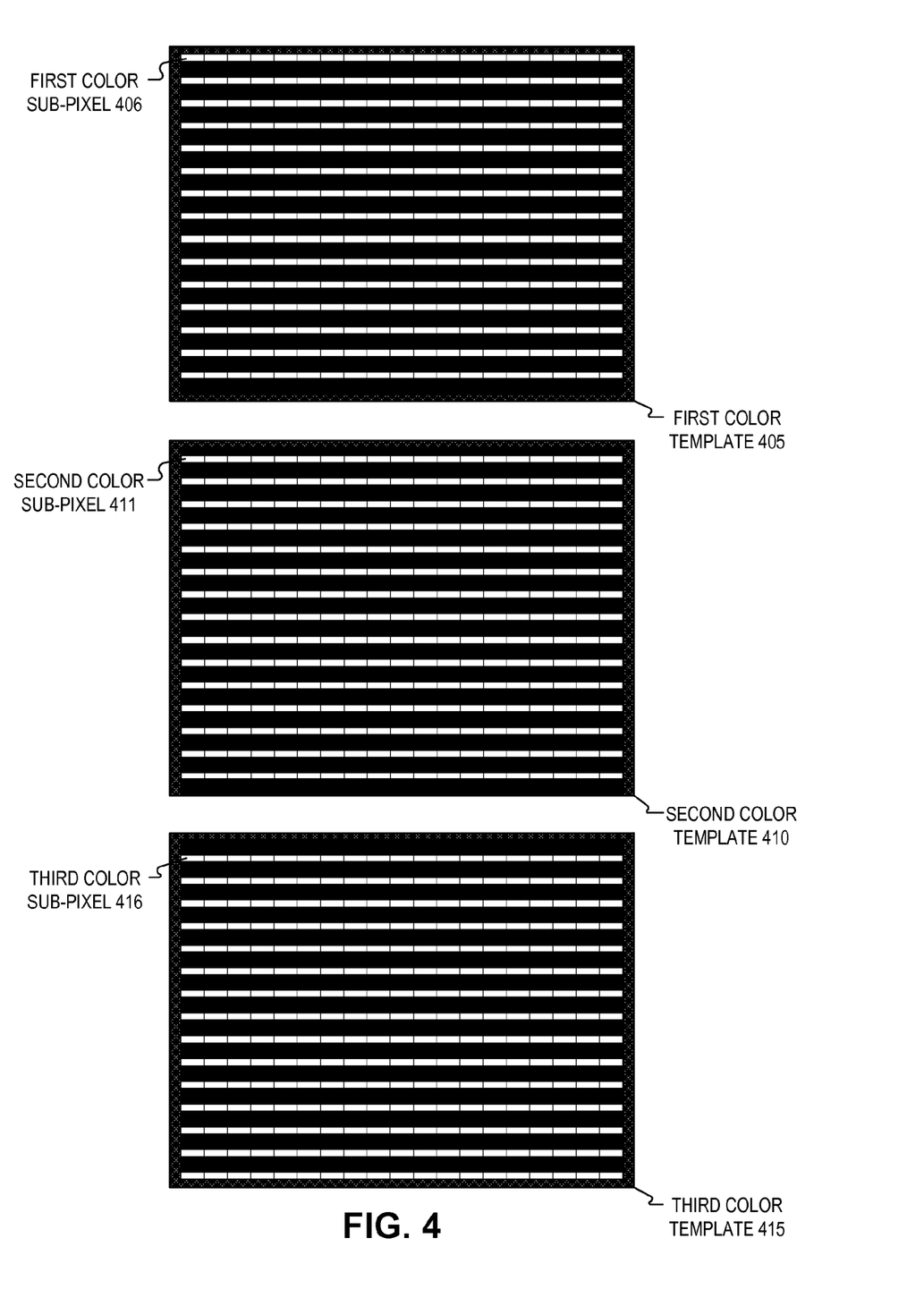
FIG. 4 illustrates example templates for coating a surface with photoactive material, in accordance with an embodiment of the disclosure.

FIG. 4 illustrates example templates for coating a surface with photoactive material, in accordance with an embodiment of the disclosure. FIG. 4 shows first color template 405 having first color sub-pixel 406, second color template 410 having second color sub-pixel 411, and third color template 415 having third color sub-pixel 416. By painting these templates with three different colors of photoactive paint, a color display may be created in conjunction with EM modulator 125 having a laser of a single wavelength to stimulate the three different colors of photoactive paint to generate a color image.

To make a display using the three illustrated templates, a display area is selected and first color template 405 is disposed on the selected display area. A first color photoactive paint (e.g. emits red light when stimulated) is painted onto first color template 405, covering approximately ⅓ of the selected display area with horizontal rows of first color photoactive paint. It is appreciated that the sub-pixels are shown in FIG. 4 for illustration purposes and that the templates may only include horizontal stripes (rows) rather than including individual sub-pixels. The display units 105 will stimulate the sub-pixels on an individual basis to generate the desired image. Then, second color template 410 is disposed on the selected display area and a second color photoactive paint (e.g. emits green light when stimulated) is painted onto second color template 410, covering approximately ⅓ of the selected display area with horizontal rows of the second color photoactive paint. Finally, third color template 415 is disposed on the selected display area and a third color photoactive paint (e.g. emits blue light when stimulated) is painted onto third color template 415, covering approximately ⅓ of the selected display area with horizontal rows of the third color photoactive paint. The end result is the selected display area having three (repeating rows) of colors (e.g. red, green, blue).

After the three paints are applied with their corresponding templates, EM modulator 125 may stimulate the sub-pixels to generate the desired color light for each pixel of the display. When the first color sub pixels 406 are stimulated, they subsequently emit or reflect a first color (e.g. red) light for a period of time, when the second color sub pixels 411 are stimulated, they subsequently emit or reflect the second color (e.g. green) light for a period of time, and when the third color sub pixels 416 are stimulated, they subsequently emit or reflect the third color (e.g. blue) light for a period of time. By aligning or timing EM waves 127 from EM modulator 125 with the color, the appearance of color images and videos may be created. Of course, other color combinations, or even gray scale paints may be used. It is appreciated that the size of the horizontal rows of paint and the corresponding sub-pixels are for example purposes and there may be embodiments with many more sub-pixels than illustrated.

The intensity or duration of stimulation of first color sub-pixel 406, second color sub-pixel 411, and third color sub-pixel 416 can be varied to get the desired color from the pixel. The intensity of the stimulation may be varied by changing a duty cycle of the emitted laser light.

To be able to precisely generate an image on the painted selected display area, EM modulator 125 may need to generate a registration image to have the camera module 132 capture and logic engine 150 to analyze. Logic engine 150 can then facilitate adjustments of EM modulator 125 to orient it to accurately stimulate the sub-pixels to generate images.

In one embodiment, instead of using templates, photoactive materials that become darker or emit different colors of light are homogenously mixed into a single transparent paint product. In one example, the different photoactive materials turn red, green, and blue or emit red, green, and blue light, when stimulated. When the transparent paint is painted on the wall, a randomized substantially homogenous mixture of the photoactive materials is applied to the wall. Then, to have a certain pixel or sub-pixel of an image display the desired color, EM modulator 125 stimulates the certain pixel or sub-pixel with the radiation characteristics (e.g. wavelength of light) that corresponds with the desired color to be displayed by the pixel or sub-pixel. Because of the generally transparent nature of the paint, a wall having a color from conventional color paint could still show through the transparent photoactive paint when the transparent photoactive paint is not being stimulated.

Figure 5:
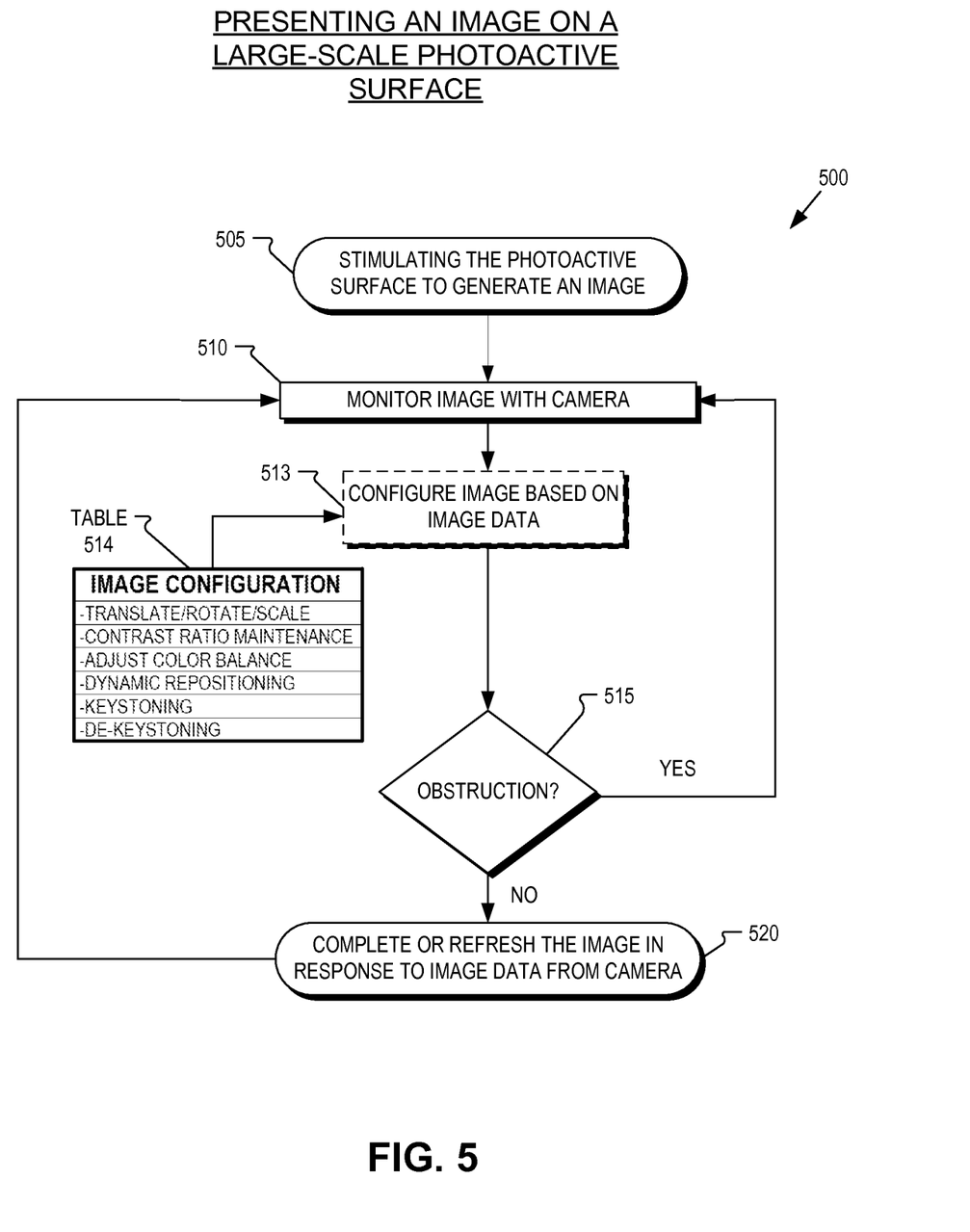
FIG. 5 is a flow chart illustrating a method of generating an image on a large-scale photoactive surface, in accordance with an embodiment of the disclosure.

FIG. 5 is a flow chart illustrating a process 500 of generating an image on a large-scale photoactive surface, in accordance with an embodiment of the disclosure. The order in which some or all of the process blocks appear in process 500 should not be deemed limiting. Rather, one of ordinary skill in the art having the benefit of the present disclosure will understand that some of the process blocks may be executed in a variety of orders not illustrated, or even in parallel.

In process block 505, the large-scale photoactive surface is stimulated with EM waves (e.g. EM waves 127) to generate at least a portion of an image. In process block 510, a camera module (e.g. camera module 132) monitors the image or the portion of the image to collect image data. The image data is analyzed to determine if there are any obstructions between the camera module and the large-scale photoactive surface, in process block 515. If there is an obstruction, the process returns to process block 510 to monitor the image with the camera module. When the image data shows that there is not an obstruction, process block 515 continues to process block 520 where the image on the large-scale photoactive surface is completed or refreshed by stimulating the photoactive surface with EM waves. The process then returns to process block 510 for monitoring. In one embodiment, image data from the camera module is analyzed to determine if human or animal eyes may receive harmful radiation from the EM waves directed at the photoactive surface and pauses the stimulating of the photoactive surface if the human or animal eyes may receive harmful radiation.

Optionally, in process block 513, the image is configured based on the image data from the camera module. The image configuration may include a variety of adjustments or transformations (shown in Table 514) of the image(s) by logic engine 150 in response to receiving image data from camera module 132. Logic engine 150 may then command EM modulator 125 to complete or refresh the image(s) according to the image configurations. For example, the image(s) may be translated, rotated, and/or scaled/zoomed to fit the photoactive surface. A contrast ratio of the image may be dynamically maintained to meet a pre-determined fixed contrast ratio. EM modulator 125 may selectively refresh portions of the image, but not other portions, to maintain the contrast ratio. For example, if ambient light is incident on a first portion of the photoactive display surface, but not a second portion, logic engine 150 may command EM modulator 125 to refresh a portion of the image in the first portion of the photoactive display surface having ambient light on it, based on image data received from camera module 132. If the ambient light is subsequently taken off the photoactive display surface, the refresh rate of EM modulator 125 can be decreased and still maintain the fixed contrast ratio of the image displayed on the photoactive display surface.

Still referring to process block 513 and image configuration, if the photoactive display surface allows for more than one color to be displayed, the intensity of the colors may be varied to achieve a pre-set color balance. In one embodiment of image configuration, keystone correction is applied to the images(s). Or, the image may be de-keystoned to optimize the image for generating the image(s) on non-flat surfaces. In one embodiment, the image bay be split into different sections and repositioned in suitable locations on the photoactive surface. In one example, a computer desktop image or mobile device home screen are divided into program or application icons and the icons are positioned on surfaces that are photoactive. Image data from camera module 132 may be used to analyze the photoactive surfaces in an environment and logic engine 150 will take care to direct the icons to appropriate photoactive surfaces (e.g. walls painted with photoactive paint) rather than non-photoactive surfaces (e.g. a window disposed within the wall).

Figure 6:
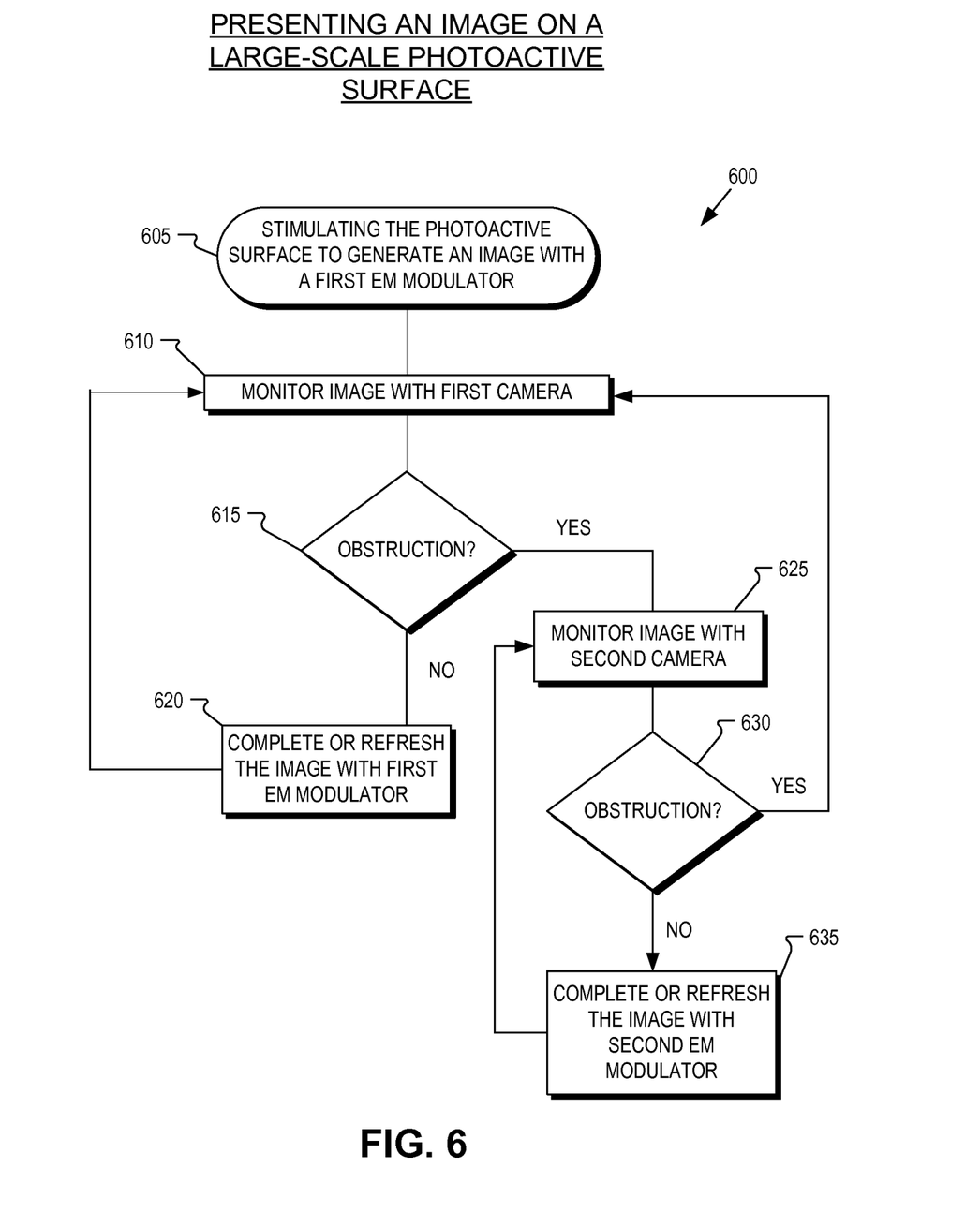
FIG. 6 is a flow chart illustrating a method of generating an image on a large-scale photoactive surface with two electromagnetic modulators, in accordance with an embodiment of the disclosure.

FIG. 6 is a flow chart illustrating a process 600 of generating an image on a large-scale photoactive surface with two electromagnetic modulators, in accordance with an embodiment of the disclosure. The order in which some or all of the process blocks appear in process 600 should not be deemed limiting. Rather, one of ordinary skill in the art having the benefit of the present disclosure will understand that some of the process blocks may be executed in a variety of orders not illustrated, or even in parallel.

In process block 605, the large-scale photoactive surface is stimulated with EM waves (e.g. EM waves 127) to generate at least a portion of an image. In process block 610, a first camera module (e.g. camera module 132) monitors the image or the portion of the image to collect image data. The image data is analyzed to determine if there are any obstructions in process block 615. If there are no obstructions, the process continues to process block 620 where the image on the large-scale photoactive surface is completed or refreshed by stimulating the photoactive surface with EM waves. If there is an obstruction, the process continues to process block 625 where a second camera module monitors the image or portion of the image to collect second image data. The second image data is analyzed to determine if there are any obstructions between the camera module and the large-scale photoactive surface, in process block 630. If there is an obstruction, the process returns to process block 610, where the first camera continues to monitor the image. In process block 630, if the second image data is analyzed and no obstructions are found, then the process continues to process block 635, where the image on the large-scale photoactive surface is completed or refreshed by stimulating the photoactive surface with EM waves from a second EM modulator.

The processes explained above are described in terms of computer software and hardware. The techniques described may constitute machine-executable instructions embodied within a tangible or non-transitory machine (e.g., computer) readable storage medium, that when executed by a machine will cause the machine to perform the operations described. Additionally, the processes may be embodied within hardware, such as an application specific integrated circuit ("ASIC") or otherwise.

A tangible non-transitory machine-readable storage medium includes any mechanism that provides (i.e., stores) information in a form accessible by a machine (e.g., a computer, network device, personal digital assistant, manufacturing tool, any device with a set of one or more processors, etc.). For example, a machine-readable storage medium includes recordable/non-recordable media (e.g., read only memory (ROM), random access memory (RAM), magnetic disk storage media, optical storage media, flash memory devices, etc.).

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. A system for generating images on photoactive surfaces comprising:
   an electro-magnetic ("EM") modulator positioned to direct EM waves to a surface coated with a photoactive paint, wherein the photoactive paint includes photoactive material;
   a camera module positioned to monitor the surface coated with the photoactive paint; and
   a logic engine communicatively coupled to the camera module and to the EM modulator, the logic engine including a non-transitory storage medium that provides instructions that, when executed by the system, will cause the system to perform operations comprising:
      stimulating the surface coated with the photoactive paint with the EM waves from the EM modulator to generate a persistent image having a half-life greater than one-half second after the EM waves cease to stimulate the surface coated with the photoactive paint, wherein the photoactive material generates the persistent image having a half-life greater than one-half second after the EM waves cease to stimulate the surface coated with the photoactive paint;
      capturing image data of the surface coated with the photoactive paint and the persistent image with the camera module;
      analyzing the image data captured by the camera module with the logic engine to measure a contrast ratio of the persistent image; and
      adjusting at least one of an intensity, a stimulation duration, or a duty cycle of the EM modulator, based upon the measuring of the contrast ratio from the image data captured by the camera module, to maintain a pre-determined contrast ratio for the persistent image.

2. The system of claim 1 further comprising:
   a second EM modulator separate and distinct from the EM modulator and positioned to direct second EM waves to the surface coated with the photoactive paint, the storage medium providing further instructions, that when executed by the system, will cause the system to perform operations comprising:
   analyzing the image data to determine whether an obstruction is between a targeted portion of the persistent image and the EM modulator;
   transferring responsibility to complete or refresh the persistent image to the second EM modulator when analysis of the image data determines that the obstruction is between the targeted portion of the persistent image and the EM modulator, the targeted portion of the persistent image requiring additional stimulation to maintain a pre-determined contrast ratio; and stimulating the surface coated with the photoactive paint with the second EM waves from the second EM modulator to the targeted portion of the persistent image to provide the additional stimulation to at least maintain the pre-determined contrast ratio.

3. The system of claim 1, wherein the EM modulator includes:
   a laser coupled to generate the EM waves as laser light; and
   an electric lens coupled to selectively focus the laser light onto the surface coated with the photoactive paint.

4. The system of claim 1, wherein the EM modulator includes a laser coupled to generate the EM waves as laser light; and
   a servo motor coupled to selectively move the laser to direct the laser light to a selected location on the surface coated with the photoactive paint, wherein the servo motor is coupled to receive commands from the logic engine.

5. The system of claim 1, wherein the EM modulator includes a plurality of lasers, and wherein the plurality of lasers includes lasers emitting different wavelengths of light to generate different colors in the persistent image.

6. The system of claim 1, wherein the photoactive material is selected from the group consisting of photoluminescent, photochromic, and thermochromic materials.

7. An image generating system comprising:
   a photoactive surface coated with at least three different photoactive paints, with each of the three different photoactive paints provide a different color upon stimulation by electromagnetic ("EM") waves, and wherein the at least three different photoactive paints are formed into three distinct color templates on the photoactive surface to form respective sub-pixels;
   an electromagnetic modulator positioned to direct the EM waves to hall the photoactive surface to stimulate the photoactive surface to generate a persistent image having a half-life greater than one-half second after the EM waves cease to stimulate the photoactive surface, wherein the same EM waves stimulate the different photoactive paints;
   a camera module positioned to monitor the photoactive surface to generate image data of the persistent image on the photoactive surface; and
   a logic engine communicatively coupled to the camera module and configured to receive the image data from the camera module and analyze the image data to measure a contrast ratio of the persistent image, wherein the logic engine is communicatively coupled to the EM modulator to adjust at least one of an intensity, a stimulation duration, or a duty cycle of the EM modulator, based upon the measuring of the contrast ratio from the image data captured by the camera module, to maintain a pre-determined contrast ratio for the persistent image.

8. The image generating system of claim 7 further comprising a steerable drive module communicatively coupled to the logic engine and configured to orient at least the EM modulator toward the photoactive surface, in response to receiving motion commands from the logic engine.

9. The image generating system of claim 8, wherein the photoactive surface coats at least one wall of a room, and wherein the steerable drive module is configured to pan and tilt to generate the persistent image on the at least one wall of the room.

10. The image generating system of claim 9 further comprising an electrical connector to be coupled to an overhead lighting socket, wherein the steerable drive, the EM modulator, the camera module, and the logic engine are coupled to draw power from the overhead lighting socket.

11. The image generating system of claim 7 further comprising a proximity sensor configured to receive proximity signals from a tag and communicatively coupled to send a proximity alert to the logic engine when a tag is proximate to the proximity sensor.

12. The image generating system of claim 7 further comprising a microphone coupled to the logic engine to receive sound signals.

13. The image generating system of claim 7, wherein the camera module and the EM modulator are coupled together in a mechanically fixed position.

14. The image generating system of claim 7 further comprising:
    a second EM modulator positioned to direct second EM waves to the photoactive surface to stimulate the photoactive surface to generate the persistent image;
    a second camera module positioned to monitor the photoactive surface to generate second image data; and
    a second logic engine communicatively coupled to the second camera module and configured to receive the second image data from the second camera module and analyze the second image data, wherein the second logic engine is communicatively coupled to the second EM modulator to command the second EM modulator in response to the second image data.

15. The image generating system of claim 14, wherein the logic engine and the second logic engine are communicatively coupled.

16. The image generating system of claim 7 further comprising a communication module coupled to receive settings inputs, wherein the communication module is coupled to the logic engine.

17. A method of presenting an image on a large-scale photoactive surface, the method comprising:
    stimulating the large-scale photoactive surface with first electromagnetic waves provided by a first electromagnetic modulator to generate at least a portion of a persistent image on the large-scale photoactive surface, wherein the persistent image has a half-life greater than one-half second after the electromagnetic waves cease to stimulate the photoactive surface, wherein the large-scale photoactive surface is at least partially coated by a photoactive paint infused with one or more photoactive materials, and wherein the one or more photoactive materials generates the persistent image on the large-scale photoactive surface;
    monitoring the at least a portion of the persistent image with a first camera module to capture image data of the persistent image;
    analyzing the image data captured by the first camera module to detect obstructions between the first camera module and the large-scale photoactive surface;
    in response to no obstruction detected between the first camera module and the large-scale photoactive surface, completing or refreshing the persistent image by stimulating the large-scale photoactive surface with the first electromagnetic waves; and
    in response to an obstruction detected between the first camera module and the large-scale photoactive surface, completing or refreshing the persistent image by stimulating the large-scale photoactive surface with second electromagnetic waves, wherein the second electromagnetic waves are provided by a second electromagnetic modulator adjacently separate from the first electromagnetic modulator.

18. The method of claim 17, wherein analyzing the image data from the camera module includes measuring a contrast ratio of the persistent image, the method further comprising:
adjusting at least one of an intensity, a stimulation duration, or duty cycle of the electromagnetic waves, based upon the measuring of the contrast ratio from the image data captured by the camera module, to maintain a pre-determined contrast ratio for the persistent image.

19. The method of claim 18, wherein analyzing the image data for the obstructions includes determining if a human or animal eye may receive harmful radiation from the electromagnetic waves and pausing the stimulating of the large-scale photoactive surface with the electromagnetic waves if it is determined that the human or animal eye may receive harmful radiation from the electromagnetic waves.

20. The method of claim 17, wherein the photoactive material includes one of the group of photochromic, photoluminescent, or thermochromic material.

21. The method of claim 17 further comprising erasing at least the portion of the persistent image on the large-scale photoactive surface with second electromagnetic waves having different characteristics than the electromagnetic waves.

22. The method of claim 17, wherein the stimulating the large-scale photoactive surface with electromagnetic waves is performed by one of the first and second electromagnetic modulators.

23. The method of claim 17 further comprising:
generating environmental image data by imaging an environment with the camera module; and
configuring settings of an electromagnetic modulator that stimulates the photoactive surface, in response to the environmental image data.

24. The method of claim 17 further comprising:
receiving audio signals and generating a different persistent image or group of different persistent images based on the audio signals.

25. The method of claim 17 further comprising:
receiving radio proximity signals from a tag; and
generating a different persistent image or group of different persistent images based on the radio proximity signals.

* * * * *